United States Patent [19]
Tsuda

[11] Patent Number: 5,945,719
[45] Date of Patent: Aug. 31, 1999

[54] SEMICONDUCTOR DEVICE HAVING METAL SILICIDE LAYER

[75] Inventor: Hiroshi Tsuda, Tokyo, Japan

[73] Assignee: NEC Corporation, Tokyo, Japan

[21] Appl. No.: 09/044,158

[22] Filed: Mar. 19, 1998

[30] Foreign Application Priority Data

Mar. 21, 1997 [JP] Japan ................................. 9-087399

[51] Int. Cl.[6] ........................... H01L 29/76; H01L 29/94; H01L 31/062; H01L 31/113
[52] U.S. Cl. ........................ 257/413; 257/412; 257/751; 257/755; 257/756; 257/757; 257/763; 257/764
[58] Field of Search ...................... 257/382, 383, 257/384, 385, 412, 413, 751, 755, 756, 757, 763, 764

[56] References Cited

U.S. PATENT DOCUMENTS

| 5,710,454 | 1/1998 | Wu ........................................ 257/413 |
| 5,714,786 | 2/1998 | Gonzalez et al. ...................... 257/366 |

FOREIGN PATENT DOCUMENTS

| 62-86865 | 4/1987 | Japan . |
| 1-205468 | 8/1989 | Japan . |
| 2-35773 | 2/1990 | Japan . |

Primary Examiner—Ngân V. Ngô
Attorney, Agent, or Firm—Foley & Lardner

[57] ABSTRACT

A gate oxide film is formed on an element region at the surface of a silicon substrate. A polycrystalline silicon film doped with a large amount of phosphorus is formed on the gate oxide by the CVD method. A titanium nitride layer with about 10 nm thickness is deposited on the polycrystalline film by the sputtering method. Further, a titanium silicide thin film with a 100 nm thickness is deposited on the titanium nitride layer. Furthermore, a silicon layer with about 50 nm thickness is formed on the titanium silicide thin film. Accordingly, a gate electrode is provided.

14 Claims, 13 Drawing Sheets

SEMICONDUCTOR DEVICE HAVING METAL SILICIDE LAYER

BACKGROUND OF THE INVENTION

1. Field of the Invention

The present invention relates to a semiconductor device having a metal silicide layer capable of preventing the sheet resistance from increasing as a result of the thickness or the width of the electrode or the wire.

2. Description of the Related Art

Recently, since semiconductor devices are becoming smaller, a low resistance gate electrode having a polycide structure has been used in a MOSFET (Metal-Oxide-Semiconductor Field Effect Transistor) type semiconductor devices. The polycide structure has a metal silicide layer formed on a polycrystalline silicon film. The gate electrode with the polycide structure can be obtained by successively forming a polycrystalline silicon film and a metal silicide layer on a gate oxide film.

A method of forming a gate electrode with a polycide structure will be explained hereinafter. FIGS. 1A to 1N are cross-sectional views showing a method of fabricating a conventional semiconductor device having a gate electrode of a polycide structure in process steps.

As shown in FIG. 1A, a silicon oxide film 2 is selectively formed at the surface of a silicon substrate 1 to define the element region. As shown in FIG. 1B, a gate oxide film 3 is formed on the element region. As shown in FIG. 1C, a polycrystalline silicon film 4 is formed on the silicon oxide film 2 and the gate oxide film 3 by, for example, the CVD (chemical vapor deposition) method.

As shown in FIG. 1D, a large amount of phosphorus is doped into the polycrystalline silicon film 4 by applying a heat treatment to the polycrystalline silicon film 4 in an oxidizing atmosphere containing $POCl_3$. Accordingly, a phosphorus glass layer 5 is generated on the surface of the polycrystalline silicon film 4. As shown in FIG. 1E, the phosphorus glass layer 5 is eliminated by wet etching. The step of forming the polycrystalline silicon film 4 shown in FIG. 1C and the step of doping phosphorus to the polycrystalline silicon film 4 shown in FIG. 1D can be performed at the same time.

Then, as shown in FIG. 1F, a metal silicide thin film 7 is formed on the polycrystalline silicon film 4 by the PVD (physical vapor deposition) method or the CVD method. As shown in FIG. 1G, a silicon layer 8 is formed on the metal silicide thin film 7 by the PVD method or the CVD method. As shown in FIG. 1H, the polycrystalline silicon film 4, the metal silicide thin film 7 and the silicon layer 8 are patterned by dry etching after performing ordinary resist application step, and exposing and developing step. Accordingly, a gate electrode with a polycide structure can be formed.

As shown in FIG. 1I, as needed, by injecting impurity ions in the surface of the element region, an LDD (lightly doped drain) layer 9 is formed. As shown in FIG. 1J, an oxide film 10 is formed with good step coverage on the entire surface. As shown in FIG. 1K, a side wall insulating film 10a of the oxide film can be obtained by remaining the oxide film 10 only on the side wall surface of the polycrystalline silicon film 4, the metal silicide thin film 7 and the silicon layer 8 by anisotropic etching.

Then, as shown in FIG. 1L, impurity ions are injected in the surface of the element region to form a source-drain diffusion layer 11. As shown in FIG. 1M, an interlayer insulating film 12 is deposited on the entire surface. As shown in FIG. 1N, after selectively forming contact holes 12a in the interlayer insulating film 12, the contact holes 12a are buried with a conductive film. Therefore, drawing electrodes 13 can be formed.

In the gate electrode obtained by the above-mentioned steps, if the metal silicide thin film 7 is formed on the uppermost layer of the electrode, the metal silicide thin film 7 is damaged by ions, when the oxide film 10 is selectively eliminated by the anisotropic etching. The metal silicide thin film 7 may also be peeled off by the abnormal oxidation at the time of heat treatment under the oxidizing atmosphere. Therefore, in order to prevent the peel-off of the metal silicide thin film 7, the silicon layer 8 is formed on the metal silicide thin film 7. A method of forming a polycrystalline silicon film or an amorphous protection film on a refractory metal silicide layer is disclosed in Japanese Patent Application Laid-Open No. 1-205468. The method can prevent the damage on the refractory metal silicide layer in the step of forming the side wall insulating film 10a of the gate electrode. Also, the method can maintain the adherence between the polycrystalline silicon film and the refractory metal silicide layer in the subsequent heat treatment step.

Further, with the silicon layer 8 formed on the refractory metal silicide thin film 7, since the surface of both diffusion layer 11 and the gate electrode that is the final point of the dry etching are made of silicon when the contact holes to reach the diffusion layer 11 and the gate electrode are provided in the interlayer insulating film 12 after forming the interlayer insulating film 12, it is advantageous in that a margin with respect to the dry etching can be wider.

Further, in cleaning the contact holes 12a after etching, a cleaning liquid produced only for a silicon film can be used. Moreover, since the drawing electrodes are to be connected only to a silicon film, a process margin for obtaining a low resistance contact can be wider as well.

Furthermore, since the silicon layer 8 as the uppermost layer has a reflectance lower than that of the refractory metal silicide thin film 7, it is advantageous in that a resist film can be exposed with a good shape at the time of patterning the polycrystalline silicon film 4, the metal silicide thin film 7 and the silicon layer 8.

However, the conventional semiconductor device obtained by the fabricating method shown in FIGS. 1A to 1N has the below-mentioned problems. That is, semiconductor devices are designed to be smaller not only in the direction parallel to the substrate surface (horizontal direction) but also in the substrate thickness direction (vertical direction) according to the recent movement toward a smaller size and high integration. However, according to the above-mentioned conventional technology, if the refractory metal silicide layer such as a titanium silicide film is formed with a thickness of 200 nm or less, a problem is involved in that the sheet resistance is increased whenever a heat treatment at 800° C. or higher is performed the silicide film.

FIG. 2 is a graph showing the relationship between the sheet resistance and the wire width, with the sheet resistance along the vertical axis and the wire width along the horizontal axis. FIG. 2 shows the sheet resistance of a wire having a laminated structure consisting a 100 nm thickness polycrystalline silicon film doped with phosphorus, a 100 nm thickness titanium silicide film (refractory metal silicide layer) and a 50 nm thickness silicon layer applied with a heat treatment at 850° C. for 30 minutes. As shown in FIG. 2, the finer the wire width becomes from 0.5 μm, the resistance of the wire becomes larger to have a larger variance in the sheet resistance in the same wafer.

Accordingly, the conventional semiconductor device has a problem in that the sheet resistance increase caused by the heat treatment becomes conspicuous as the electrode width or the wire width becomes finer, or the silicide layer becomes thinner.

Various kinds of semiconductor devices having a gate electrode with a polycide structure having excellent acid resistance, etching resistance and heat resistance have been proposed. For example, a semiconductor device having a gate electrode with a laminated structure is disclosed in Japanese Patent Application Laid-Open No. 2-35773. The gate electrode has a barrier metal layer made of titanium nitride or titanium carbonate formed on a silicide layer, and an acid resistant silicide layer made of molybdenum silicide, tungsten silicide or tantalum silicide formed on the barrier metal layer. Further, a semiconductor device having a gate electrode with a laminated structure where a polycrystalline silicon layer and a refractory metal layer or a refractory metal silicide layer is formed on a substrate is disclosed in Japanese Patent Application Laid-Open No. 62-86865.

However, since the gate electrodes of the conventional laminated structures are not provided with a silicon layer as the uppermost layer, in forming contact holes to reach a diffusion layer and a gate electrode in an interlayer insulating film after the formation of the interlayer insulating film, a dry etching condition needs to be selected in order to have a larger selective ratio between the material of the interlayer insulating film, and the material of the diffusion layer and the uppermost layer of the gate electrode.

Besides, a cleaning liquid not causing damage to either of the material of the uppermost layer of the electrode or silicon needs to be selected at the time of cleaning the contact holes after etching. Accordingly, with the semiconductor devices disclosed in Japanese Patent Application Laid Open Nos. 2-35773 and 62-86865, it is difficult to have a good contact of electric characteristics to both gate electrode and diffusion layer.

SUMMARY OF THE INVENTION

An object of the present invention is to provide a semiconductor device having a metal silicide layer capable of preventing the rise of a sheet resistance caused by a heat treatment even when a fine wire or electrode of 0.5 $\mu$m or less is formed, and capable of restraining the increase of the variance of the sheet resistance.

A semiconductor device having a metal silicide layer comprises a substrate, a first silicon layer formed on the substrate, a barrier layer formed on the first silicon layer, a metal silicide layer formed on the barrier layer, and a second silicon layer formed on the metal silicide layer. The barrier layer is made of at least one compound selected from the group consisting of a nitride of a refractory metal and a carbonate of a refractory metal.

The metal silicide layer can be a film of a silicified product of at least one metal selected from the group consisting of titanium, tungsten, molybdenum, cobalt and tantalum, with a 200 nm or less film thickness. Further, the first silicon layer can be made of at least one material selected from the group consisting of a polycrystalline silicon, an amorphous silicon and a single crystalline silicon. The barrier layer can be made of a nitride or a carbonate of at least one refractory metal selected from the group consisting of titanium, tungsten, molybdenum, cobalt and tantalum.

Further, a gate electrode or a wire can be formed with the first silicon layer, the barrier layer, the metal silicide layer and the second silicon layer.

In a conventional semiconductor device having an electrode or wire with two silicon layers and a metal silicide layer formed between the two silicon layers, the increase of a sheet resistance caused by a heat treatment becomes conspicuous as the electrode width or the wire width becomes finer, or the metal silicide layer becomes thinner.

The reason why the sheet resistance increases according to the reduction of the width of the electrode or the wire is that the two silicon layers (the first silicon layer and the second silicon layer) formed above and below the metal silicide layer becomes a core to deposit silicon particles into the metal silicide layer. Therefore, the silicon particles cut off the silicide film by crossing the thin metal silicide layer. When the two silicon layers are connected by the silicon particles via the metal silicide layer, the surface energy of the heterogeneous junction between the metal silicide and the silicon is relatively reduced. Therefore, the phenomenon of connecting the two silicon layers is further facilitated.

In the present invention, since a barrier layer is provided between the first silicon layer and the metal silicide layer, the first silicon layer and the metal silicide layer do not come in contact with each other. According to the configuration, even if silicon particles are deposited from the second silicon layer on the metal silicide layer by a heat treatment, the silicon particles only grow slightly, but high resistance silicon particles are not deposited from the first silicon layer. Therefore, even when the metal silicide layer has a thickness of 200 nm or less, since the metal silicide layer is not cut by silicon particles, the tendency of the metal silicide layer having a higher resistance can be prevented, and the generation of variance of a resistance value in the same wafer can be restrained.

DETAILED DESCRIPTION OF THE PREFERRED EMBODIMENTS

Figure 1A:
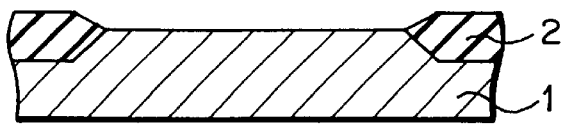
FIGS. 1A to 1N are cross-sectional views showing a method of fabricating a conventional semiconductor device having a gate electrode of a polycide structure in process steps.
Figure 1B:
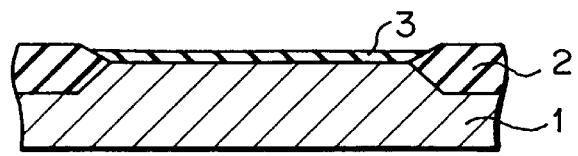
Figure 1C:
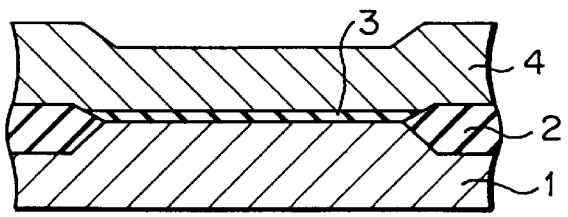
Figure 1D:
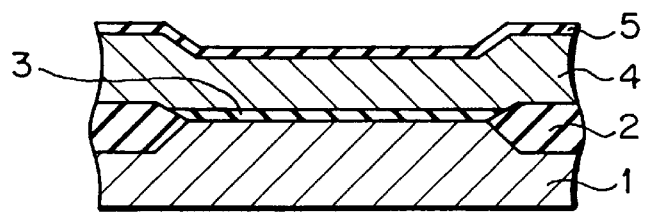
Figure 1E:
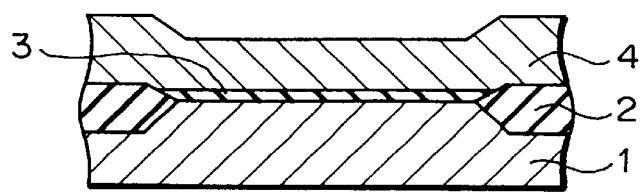
Figure 1F:
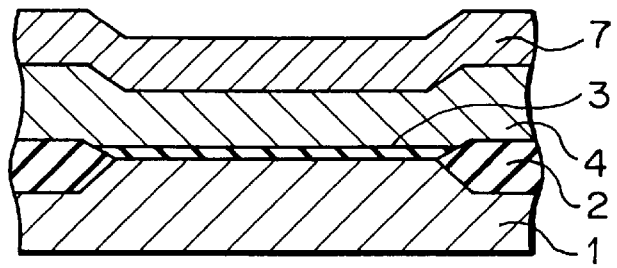
Figure 1G:
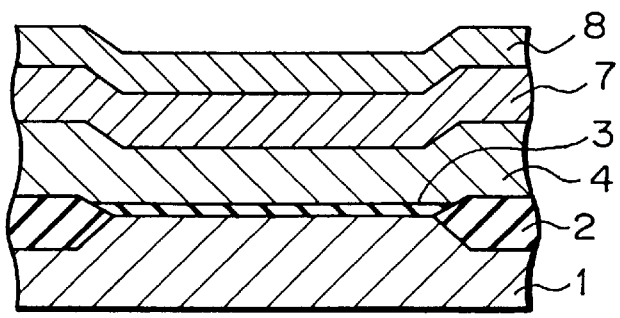
Figure 1H:
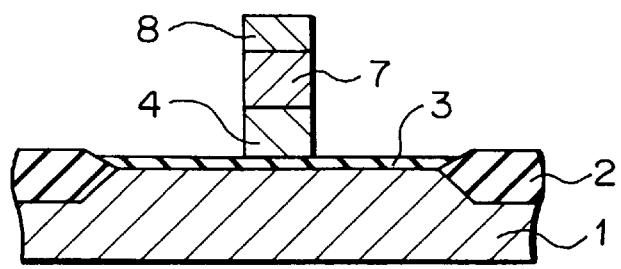
Figure 1I:
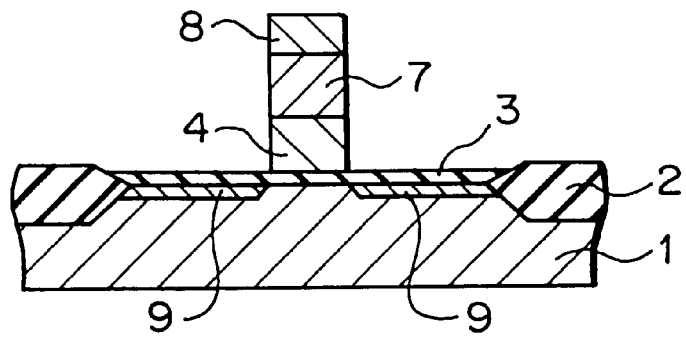
Figure 1J:
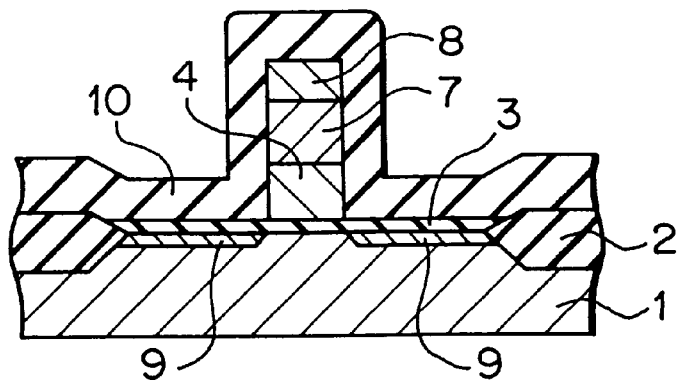
Figure 1K:
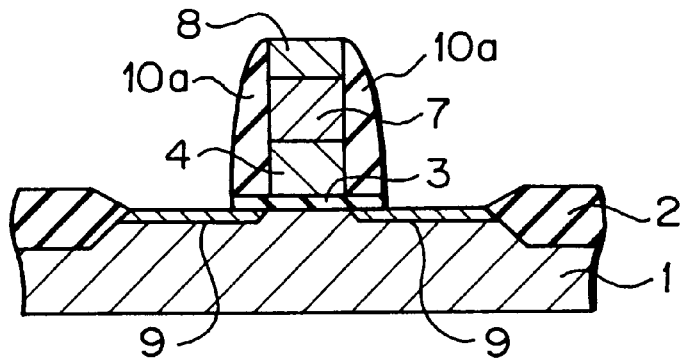
Figure 1L:
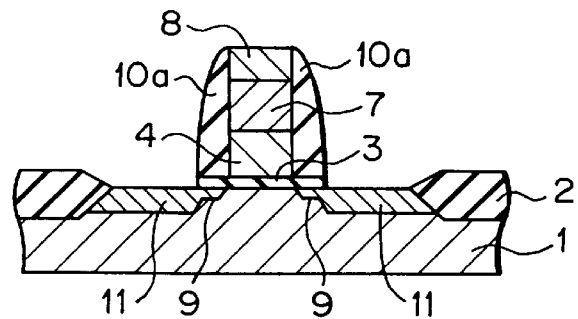
Figure 1M:
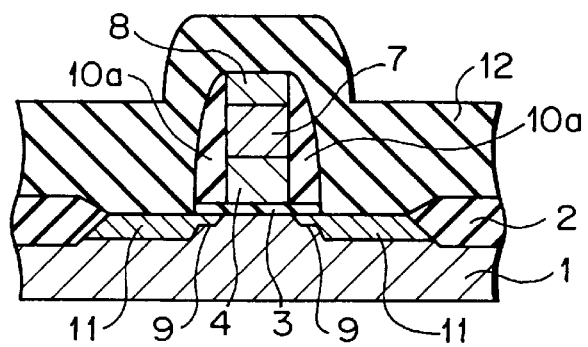
Figure 1N:
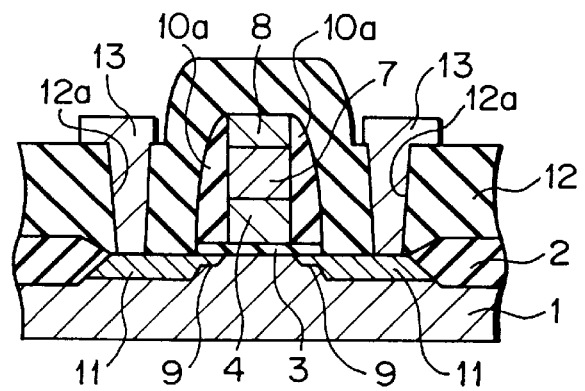
Figure 2:
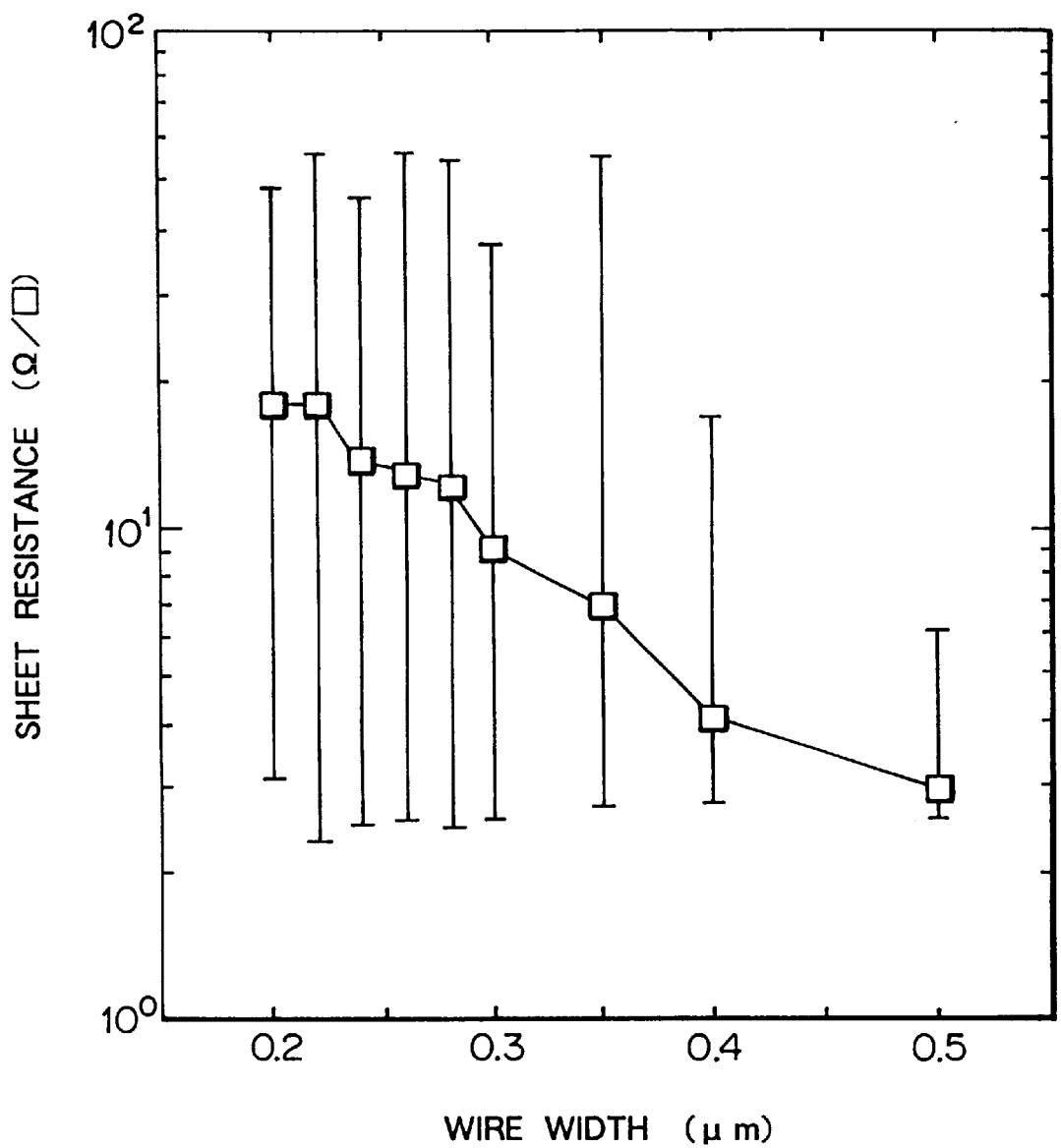
FIG. 2 is a graph showing the relationship between the sheet resistance and the wire width with taking the sheet resistance in vertical axis and the wire width in horizontal axis.
Figure 3A:
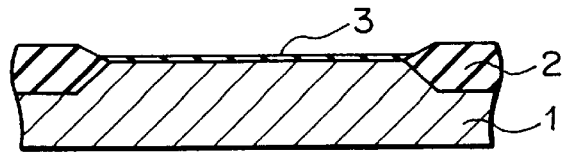
FIGS. 3A to 3O are cross-sectional views showing a method of fabricating a semiconductor device having a metal silicide layer according to a first embodiment of the present invention in process steps.
Figure 3B:
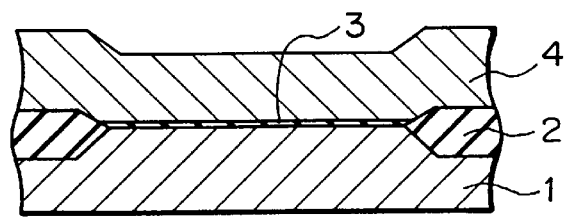
Figure 3C:
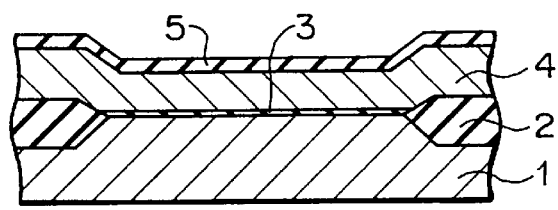

Hereinafter embodiments of the present invention will be explained concretely with reference to the accompanied drawings. FIGS. 3A to 3O are cross-sectional views showing a method of fabricating a semiconductor device having a metal silicide layer according to a first embodiment of the present invention in process steps.

First, as shown in FIG. 3A, after selectively forming a silicon oxide film 2 at the surface of a silicon substrate 1 to define an element region, a gate oxide film 3 is formed on the element region. As shown in FIG. 3B, a polycrystalline silicon film (first silicon layer) 4 is formed on the silicon oxide film 2 and the gate oxide film 3 by, for example, the CVD method. Then, as shown in FIG. 3C, by annealing for the polycrystalline silicon film 4 in an oxidizing atmosphere containing $POCl_3$, a large amount of phosphorus is doped in the polycrystalline silicon film 4. Accordingly, a phosphorus glass layer 5 is generated on the surface of the polycrystalline silicon film 4.

Figure 3D:
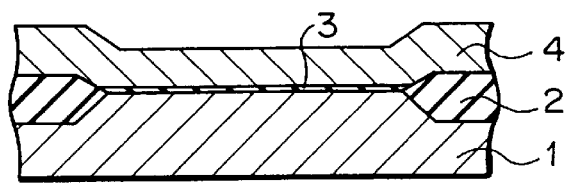
Figure 3E:
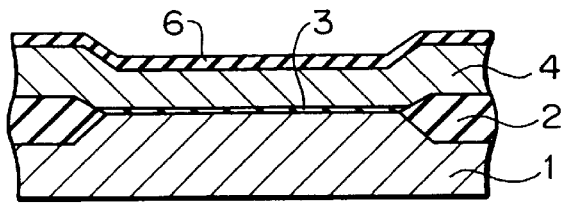

As shown in FIG. 3D, the phosphorus glass layer 5 is eliminated by wet etching. As shown in FIG. 3E, a titanium nitride layer (barrier layer) 6 of about 10 nm thickness is deposited on the polycrystalline silicon film 4 by the sputtering method, which is a kind of a PVD (physical vapor deposition) method. The condition of the sputtering includes, for example, that a target made of pure titanium is used in a 1:1 gas mixture atmosphere of argon gas and nitride gas with 2.5 mTorr pressure and a 4.5 kW input power without intentional heating.

Figure 3F:
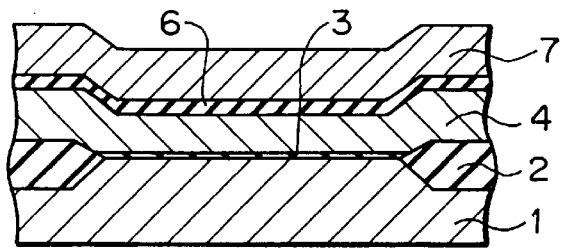
Figure 3G:
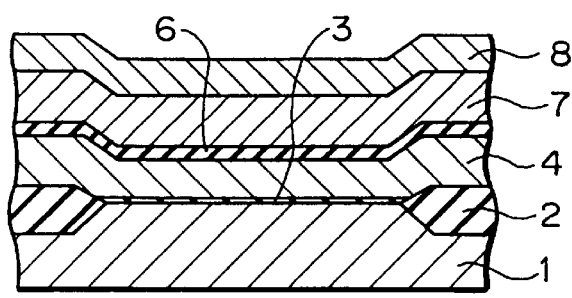

As shown in FIG. 3F, a titanium silicide thin film (metal silicide layer) 7 of 100 nm thickness is deposited on the titanium nitride layer 6 by the sputtering method. The condition of the sputtering includes, for example, that a target of a titanium silicide alloy is used in an argon gas atmosphere with 8 mTorr pressure and a 2 kW input power without intentional heating. Accordingly, an amorphous titanium silicide thin film 7 is formed on the titanium nitride layer 6. Thereafter, as shown in FIG. 3G, a silicon layer (second silicon layer) 8 is formed by about 50 nm thickness on the titanium silicide thin film 7 by the sputtering method.

Figure 3H:
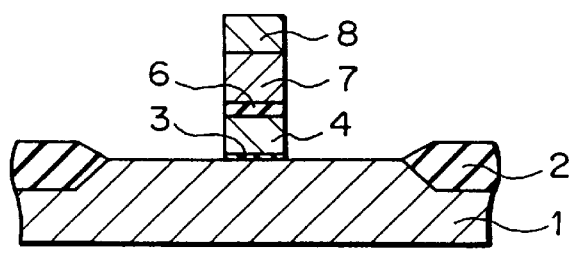
Figure 3I:
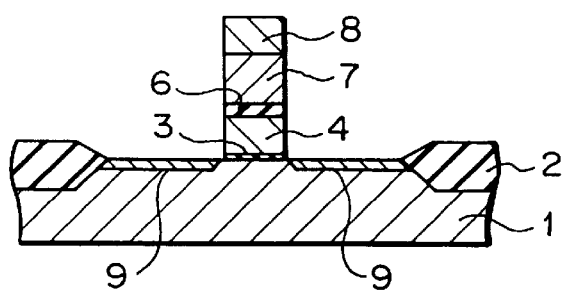
Figure 3J:
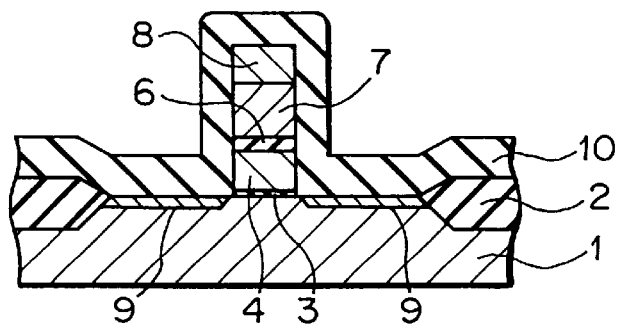
Figure 3K:
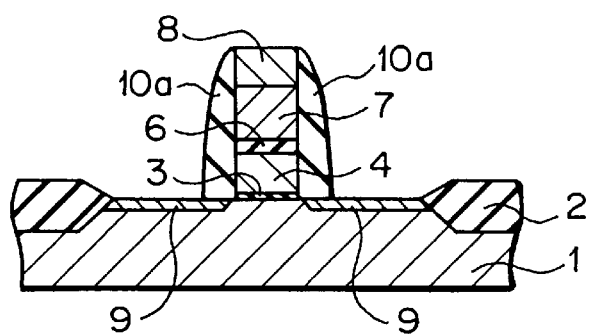

As shown in FIG. 3H, the gate oxide film 3, the polycrystalline silicon film 4, the titanium nitride layer 6, the titanium silicide thin film 7 and the silicon layer 8 are patterned by dry etching after performing ordinary resist application step, exposing step and developing step. Accordingly, a gate electrode having a metal silicide layer can be obtained. As shown in FIG. 3I, by injecting impurity ions in the surface of the element region, an LDD (lightly doped drain) layer 9 is formed. Then as shown in FIG. 3J, an oxide film 10 is formed with good step coverage on the entire surface. As shown in FIG. 3K, a side wall insulating film 10*a* made of the oxide film can be obtained by remaining the oxide film 10 only on the side wall surface of the gate electrode consisting the gate oxide film 3, the polycrystalline silicon film 4, the titanium nitride layer 6, the titanium silicide thin film 7 and the silicon layer 8 by the anisotropic etching.

Figure 3L:
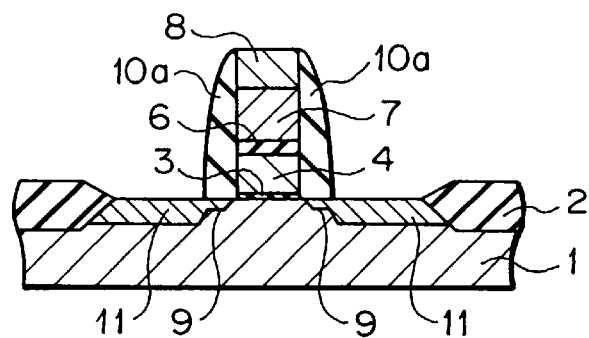
Figure 3M:
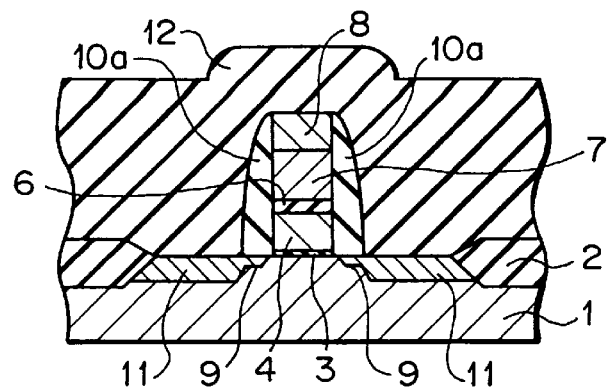

Then, as shown in FIG. 3L, impurity ions are injected in the surface of the element region to form a source-drain diffusion layer 11. As shown in FIG. 3M, an interlayer insulating film 12 is deposited on the entire surface. In the step of depositing the interlayer insulating film 12, an annealing for the substrate with a temperature of 850° C. is performed for total 30 minutes. By the annealing, the titanium silicide thin film 7 can be crystallized to have a low resistance, the impurities injected in the diffusion layer 11 can be activated, and the interlayer insulating film 12 can be densified.

Figure 3N:
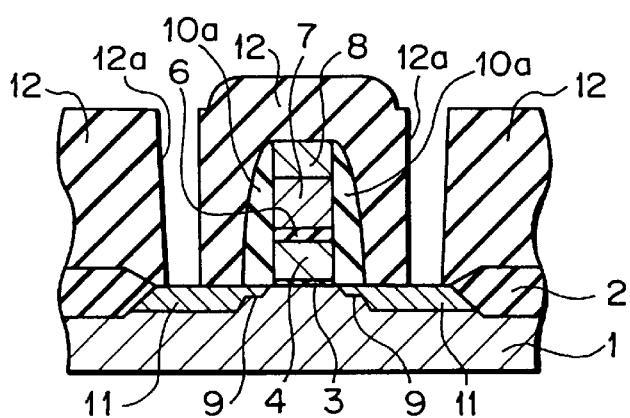
Figure 3O:
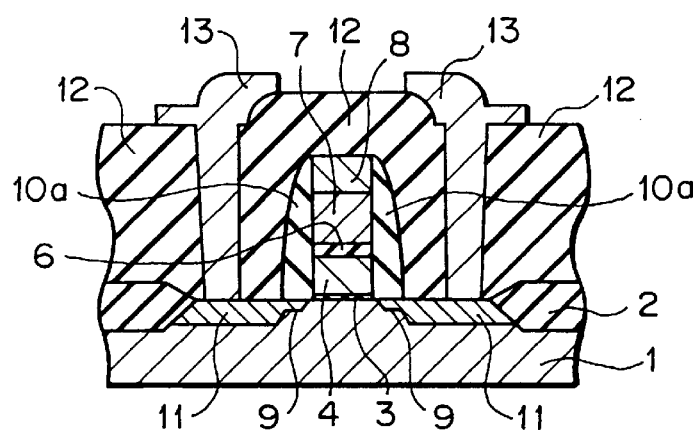

Then, as shown in FIG. 3N, after selectively forming contact holes 12*a* in the interlayer insulating film 12, the contact holes 12*a* is buried with a conductive film and the conductive film is processed. Therefore, drawing electrodes (source electrodes and drain electrodes) 13 can be formed. Then, a drawing electrode (not shown) to be connected to the gate electrode will be formed.

In this embodiment with the above-mentioned configuration, the titanium nitride layer 6 is formed between the polycrystalline silicon film 4 and the titanium silicide thin film 7 so that the polycrystalline silicon film 4 and the titanium silicide thin film 7 do not contact with each other. According to the configuration, even if silicon particles are deposited from the silicon film 8 on the titanium silicide thin film 7, the silicon particles only grow slightly without the risk of depositing high resistance silicon particles from the polycrystalline silicon film 4. Therefore, even if the thickness of the titanium silicide thin film 7 is in the range of 50 to 250 nm, in particular, less than 200 nm, since the titanium silicide thin film 7 cannot be completely cut by the silicon particles to prevent the resistance of the titanium silicide thin film 7 from increasing. Also, generation of the variance of the resistance value in one wafer can be restrained.

Figure 4:
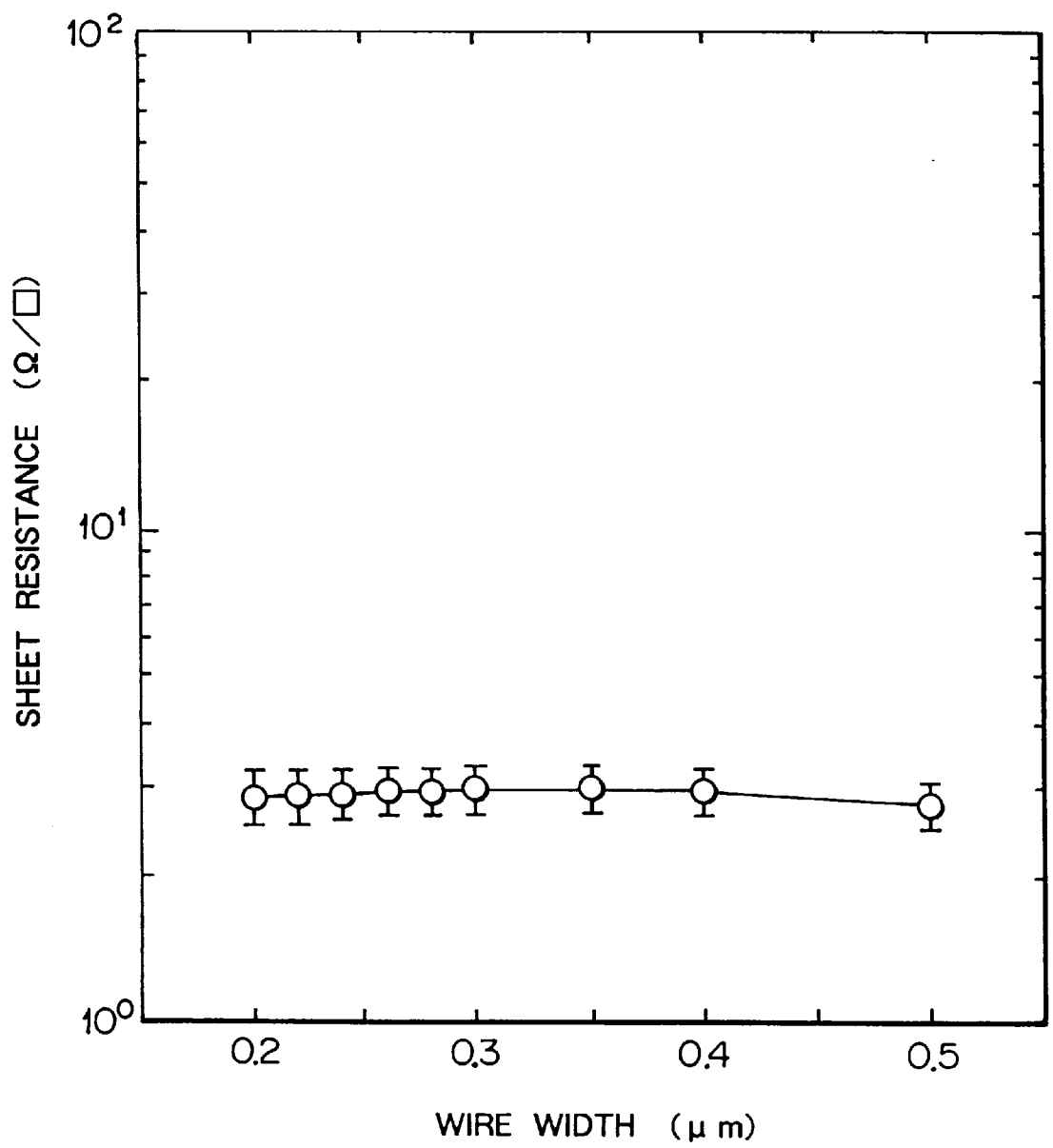
FIG. 4 is a graph showing the relationship between the sheet resistance and the wire width with taking the sheet resistance in vertical axis and the wire width in horizontal axis.

FIG. 4 is a graph showing the relationship between the sheet resistance and the wire width with taking the sheet resistance in vertical axis and the wire width in horizontal axis. As shown in FIG. 4, in this embodiment, when the thickness of the titanium silicide thin film 7 is 100 nm, even with the wire width of 0.2 to 0.5 $\mu$m, the average value of the sheet resistance is about 3 $\Omega/\square$. Accordingly, the sheet resistance does not increase as the wire width becomes smaller, besides, the variance in the sheet resistance can be reduced remarkably.

In the present invention, the temperature, pressure, and film thickness at the step of forming the titanium nitride layer and the titanium silicide thin film are not particularly limited, but can be modified in various ways in the range the effects of the present invention can be achieved. Although the case of forming a titanium silicide thin film was explained in this embodiment as the metal silicide layer, a metal silicide layer made of any one selected from the group consisting of tungsten silicide, molybdenum silicide, cobalt silicide and tantalum silicide, or a material made of a combination of the metal silicides can be used as well.

Further, although the case of forming a metal silicide layer on a polycrystalline silicon film 4 having the titanium nitride layer 6 formed thereon to provide a gate electrode is explained in this embodiment, the under layer of the metal silicide layer is not limited to the polycrystalline silicon film in the present invention, but can be formed with an amorphous silicon film or a single crystalline silicon film. Moreover, instead of forming a titanium nitride layer on the polycrystalline silicon film 4, a titanium carbonate layer can be formed. Furthermore, a layer made of a nitride or a carbonate of one refractory metal selected from the group consisting of tungsten, molybdenum, cobalt and tantalum, or a layer made of a combination thereof can be formed on the polycrystalline silicon film 4.

The method of forming a nitride or a carbonate of a refractory metal is not limited to the PVD method, but the CVD method can be used as well. Further, a metal to be used as a target in forming a nitride or a carbonate of a refractory metal by a sputtering, which is a kind in which the PVD method is not necessarily a pure metal, but the target itself can be a nitride or a carbonate of a refractory metal.

Furthermore, in the present invention, even when a multi-layer wire is formed instead of the drawing electrode 13 to use the multi-layer wire as the gate electrode of a logic type semiconductor device, the laminate structure of the gate electrode shown in FIG. 3 can be used for the multi-layer wire. Moreover, the effects of the present invention can be obtained by forming a trench type capacitor before forming the gate electrode shown in FIG. 3, or forming a stuck capacity after forming the gate electrode to form a gate electrode of a DRAM (dynamic random access memory).

FIGS. 5A to 5H are cross-sectional views showing a method of fabricating a semiconductor device having a metal silicide layer according to a second embodiment of the present invention in process steps. FIGS. 5A to 5H show the case of applying the present invention to a signal line of a DRAM, that is, the method of fabricating after forming the interlayer insulating film 12 on the gate electrode shown in FIG. 3M are described in process steps. Therefore, in the second embodiment shown in FIGS. 5A to 5H, portions the same as those of the first embodiment shown in FIGS. 3A to 3O are applied with the same numerals and further explanation is not provided herein.

Figure 5A:
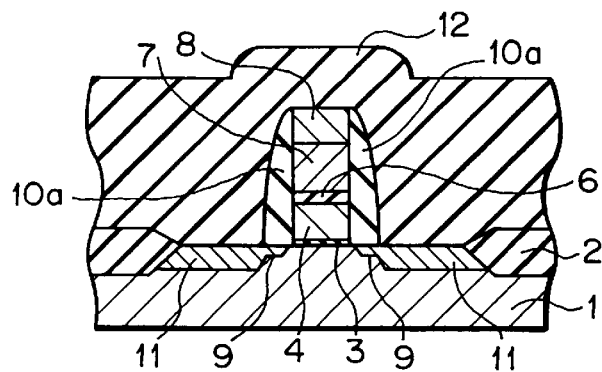
FIGS. 5A to 5H are cross-sectional views showing a method of fabricating a semiconductor device having a metal silicide layer according to a second embodiment of the present invention in process steps.
Figure 5B:
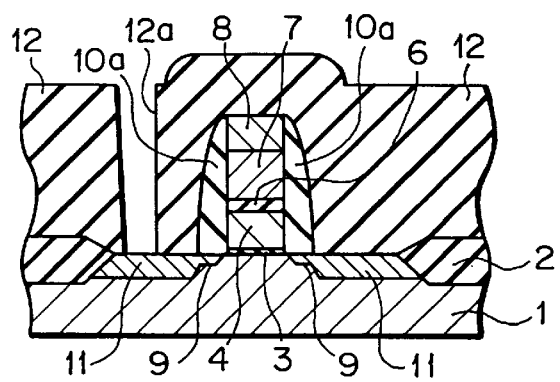
Figure 5C:
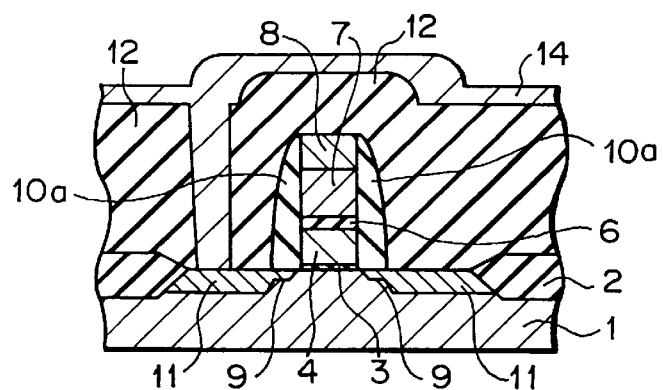
Figure 5D:
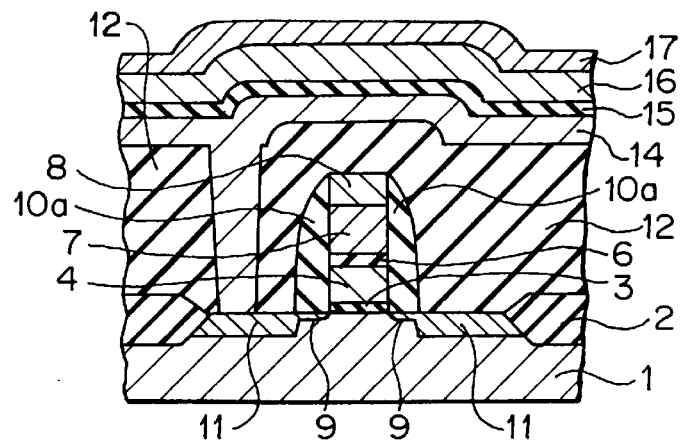

As shown in FIG. 5A, the interlayer insulating film 12 is formed on the substrate 1 where the gate electrode is already formed thereon. As shown in FIG. 5B, a contact hole 12a for the source electrode to reach the source-drain diffusion layer 11 is provided in the interlayer insulating film 12 on one of the source-drain diffusion layers 11. After cleaning the surface as shown in FIG. 5C, a polycrystalline silicon film (first silicon layer) 14 is formed on the entire surface by the CVD method. After injecting phosphorus in the polycrystalline silicon film 14 to have a low resistance in the polycrystalline silicon film 14, a titanium nitride layer (barrier layer) 15 of 10 nm thickness and a titanium silicide layer (metal silicide layer) 16 of about 100 nm thickness are successively deposited on the polycrystalline silicon film 14 as in the first embodiment. Then, a silicon layer (second silicon layer) 17 is formed by about 50 nm thickness on the titanium silicide layer 16 by the sputtering method.

Figure 5E:
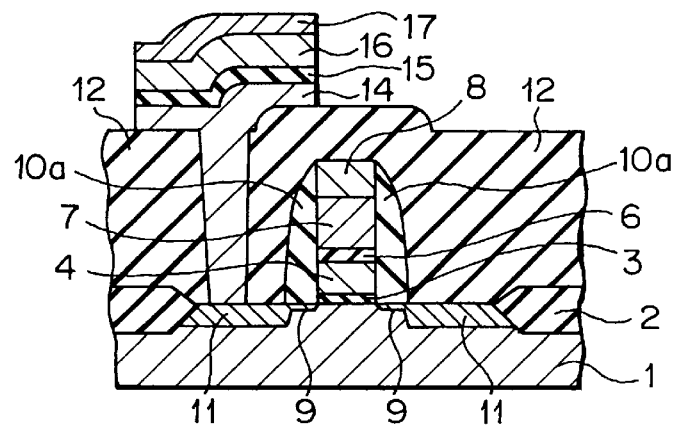
Figure 5F:
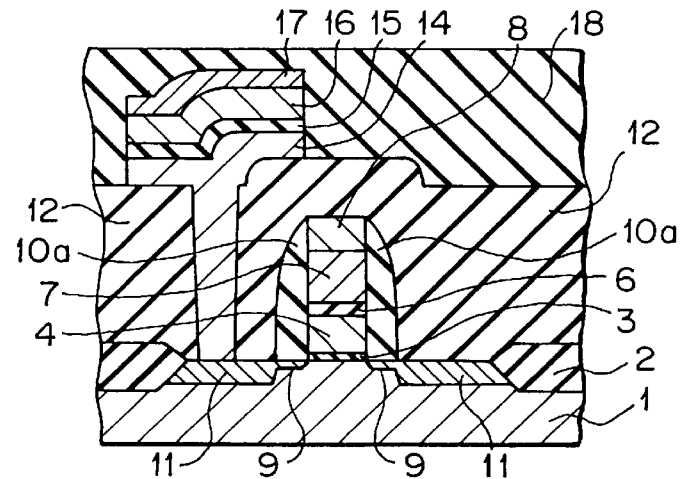

As shown in FIG. 5E, the polycrystalline silicon film 14, the titanium nitride layer 15, the titanium silicide layer 16 and the silicon layer 17 are patterned by dry etching after performing ordinary resist application step, exposing step and developing step. Accordingly, a signal line (wire) having a metal silicide layer can be obtained. As shown in FIG. 5F, by depositing the interlayer insulating film 18 on the entire surface, and annealing for the substrate with a temperature of 850° C. for 10 minutes, the titanium silicide layer 16 can be crystallized to have a low resistance, and the interlayer insulating film 18 can be densified.

Figure 5G:
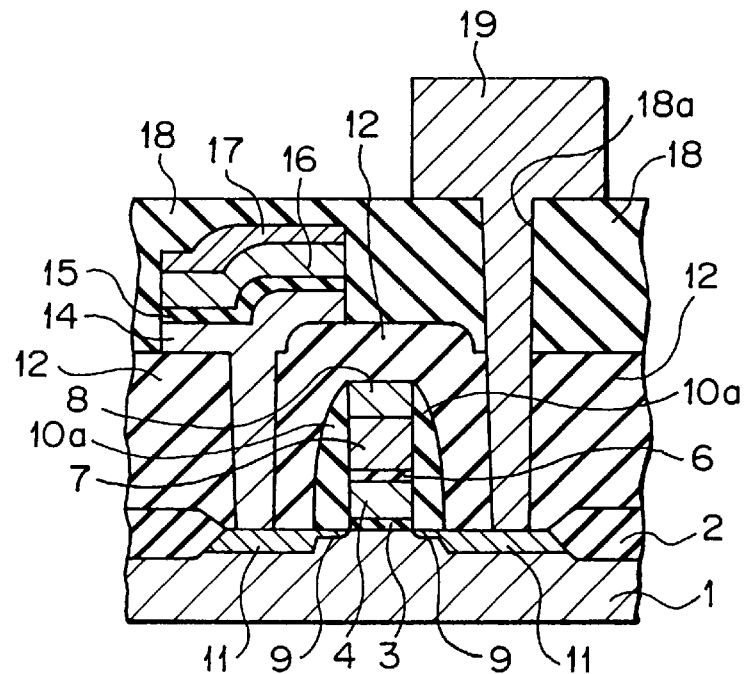
Figure 5H:
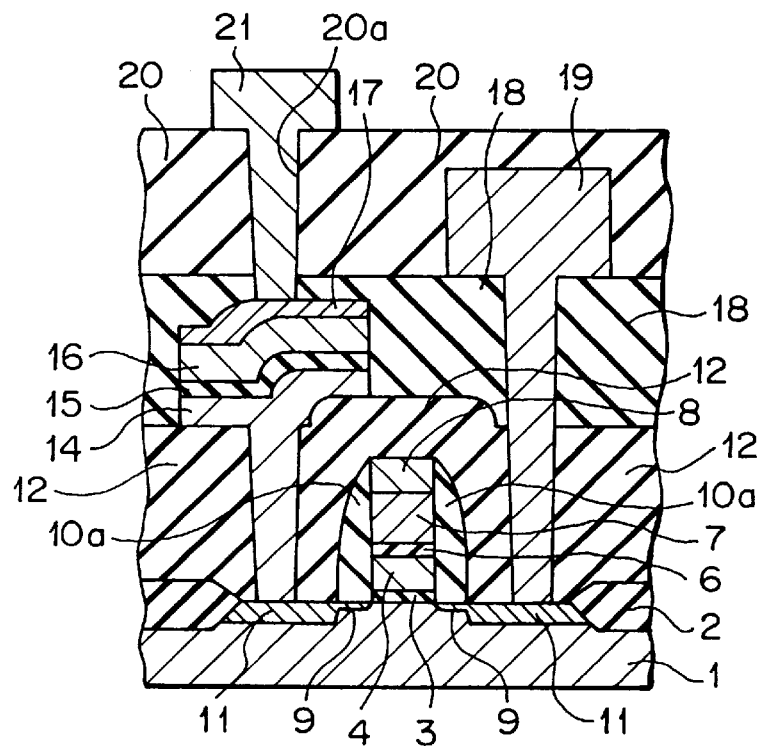

Then, as shown in FIG. 5G, a contact hole 18a for the drain electrode to reach the source-drain diffusion layer 11 is provided in the interlayer insulating film 18 on the other source-drain diffusion layer 11. Then, the contact hole 18a is buried with a stuck type capacitor film 19. As shown in FIG. 5H, an interlayer insulating film 20 is formed on the capacitor film 19 and the interlayer insulating film 18. After forming a contact hole 20a for forming the drawing electrode to reach the silicon layer 17 from the surface of the interlayer insulating film 20, a conductive film is deposited in the contact hole 20a and the conductive film is processed into a desired shape, a drawing electrode 21 can be obtained.

In the second embodiment, with the wire width of 0.2 to 0.5 μm, the average value of the sheet resistance is 3 Ω/□. Accordingly, the sheet resistance does not increase as the wire width becomes smaller, and, the variance in the sheet resistance can be reduced remarkably.

What is claimed is:

1. A semiconductor device having a metal silicide layer comprising:

a substrate, a first silicon layer formed over said substrate, a barrier layer formed on said first silicon layer, said barrier layer being made of at least one compound selected from the group consisting of a nitride of a refractory metal and a carbonate of a refractory metal, a metal silicide layer formed on said barrier layer, and a second silicon layer formed on said metal silicide layer.

2. A semiconductor device according to claim 1, wherein said metal silicide layer is a silicified film of at least one metal selected from the group consisting of titanium, tungsten, molybdenum, cobalt and tantalum.

3. A semiconductor device according to claim 1, wherein said metal silicide layer has a 200 nm or less film thickness.

4. A semiconductor device according to claim 1, wherein said first silicon layer is made of at least one material selected from the group consisting of a polycrystalline silicon, an amorphous silicon and a single crystalline silicon.

5. A semiconductor device according to claim 1, wherein said barrier layer is made of a nitride or a carbonate of at least one refractory metal selected from the group consisting of titanium, tungsten, molybdenum, cobalt and tantalum.

6. A semiconductor device according to claim 1, wherein said first silicon layer, said barrier layer, said metal silicide layer and said second silicon layer comprise a gate electrode.

7. A semiconductor device according to claim 6, further comprising a gate insulating film between said substrate and said first silicon layer.

8. A semiconductor device according to claim 6, further comprising a side wall insulating film formed on the side wall surface of said gate electrode.

9. A semiconductor device according to claim 6, further comprising a source-drain diffusion layer formed at said substrate surface in a region interposing said gate electrode.

10. A semiconductor device according to claim 9, further comprising a source electrode and a drain electrode electrically connected to said source-drain diffusion layers.

11. A semiconductor device according to claim 1, wherein said first silicon layer, said barrier layer, said metal silicide layer and said second silicon layer comprise a wire.

12. A semiconductor device according to claim 11, further comprising an interlayer insulating film having a contact hole, formed on said substrate, said contact hole being filled with the material of said first silicon layer.

13. A semiconductor device according to claim 11, further comprising a source-drain diffusion layer electrically connected to said wire, formed on said surface of said substrate.

14. A semiconductor device according to claim 12, wherein said first silicon layer, said barrier layer, said metal silicide layer and said second silicon layer further comprise a gate electrode formed over said substrate, and covered with said interlayer insulating film.

* * * * *